United States Patent [19]
Mester

[11] Patent Number: 5,365,529
[45] Date of Patent: Nov. 15, 1994

[54] CIRCUITRY FOR DETECTING AND CORRECTING ERRORS IN DATA WORDS OCCURRING IN REED-SOLOMON CODED BLOCKS AND DETERMINING WHEN ERRORS ARE UNCORRECTABLE BY SYNDROME ANALYSIS, EUCLID'S ALGORITHM AND A CHIEN SEARCH

[75] Inventor: Roland Mester, Darmstadt, Germany
[73] Assignee: BTS Broadcast Television Systems GmbH, Darmstadt, Germany
[21] Appl. No.: 805,766
[22] Filed: Dec. 12, 1991

[30] Foreign Application Priority Data
Feb. 25, 1991 [DE] Germany .................. 4105860

[51] Int. Cl.⁵ .................................. G06F 11/00
[52] U.S. Cl. .......................... 371/37.1; 371/38.1; 371/39.1
[58] Field of Search ............... 371/37.1, 38.1, 39.1

[56] References Cited
U.S. PATENT DOCUMENTS

| | | | |
|---|---|---|---|
| 4,494,234 | 1/1985 | Patel | 371/38 |
| 4,665,523 | 5/1987 | Citron et al. | 371/37.1 |
| 4,868,828 | 9/1989 | Shao et al. | 371/5.1 |
| 4,873,688 | 10/1989 | Maki et al. | 371/37.1 |
| 4,958,348 | 9/1990 | Berlekamp et al. | 371/37.1 |
| 5,099,482 | 3/1992 | Cameron | 371/37.1 |
| 5,170,399 | 12/1992 | Cameron | 371/37.1 |
| 5,208,815 | 5/1993 | Kojima | 371/37.1 |

OTHER PUBLICATIONS

"On-the-Fly Decoder for Multiple Byte Errors", IBM Journal of Research and Development, vol. 30, No. 3 (May 1986), pp. 259-269.
"A 40 MHz Encoder/Decoder Chip Generated by a Reed-Solomon Code Complier", IEEE 1990 Custom Integrated Circuits Conference, CH 2860-5/90/00-00-0065, pp. 13.5.1-13.5.4.

Primary Examiner—Robert W. Beausoliel, Jr.
Assistant Examiner—Phillip F. Vales
Attorney, Agent, or Firm—Karl F. Milde, Jr.

[57] ABSTRACT

Circuitry for detecting and correcting errors in data words occurring in Reed-Solomon coded blocks contains a plurality of stages. One stage constructs syndromes in the data flowing through the blocks. Another stage detects erasures in the syndromes. Another stage applies a Euclid's algorithm with $$T_s(x) = \{Q_{s-1}(x) \cdot T_{s-1}(x)\} + T_{s-2}(x),$$

$$R_s(x) = \{Q_{s-1}(x) \cdot R_{s-1}(x)\} + R_{s-2}(x),$$

and $$I\ Q_{s-1}(x) = R_{s-2}(x)/R_{s-1}(x)$$

wherein $T_s(x)$, $R_s(x)$, and $Q_{s-1}(x)$ are polynomials representing the position of the error, its value, and a provisional value respectively, and $R_s(x)$ and $T_s(x)$ can be normalized with a minimal coefficient $T_s(0) = \delta$ such that $R(x) = R_s(xi/\delta)$ and $T(x) = T_s(x)/\delta$. Another stage detects error positions $X_k$ and values $Y_k$ by conducting a Chien zero-root search in conjunction with $$Y_k = \frac{R(X_k)}{X_k^b \cdot T'(X_k)}$$

wherein $T'(X_k)$ is the first derivative of T at a place $x_k$. Another stage uses the accordingly calculated error positions $X_k$ and values $Y_k$ to correct signal-duration matched data words in a currently occurring Reed-Solomon coded block.

4 Claims, 2 Drawing Sheets

CIRCUITRY FOR DETECTING AND CORRECTING ERRORS IN DATA WORDS OCCURRING IN REED-SOLOMON CODED BLOCKS AND DETERMINING WHEN ERRORS ARE UNCORRECTABLE BY SYNDROME ANALYSIS, EUCLID'S ALGORITHM AND A CHIEN SEARCH

BACKGROUND OF THE INVENTION

The present invention relates to circuitry for detecting and correcting errors in data words occurring in Reed-Solomon (RS) coded blocks. The circuitry comprises a stage that constructs syndromes (defined hereinafter) in the data flowing through the blocks; a stage that detects erasures in the syndromes; a stage that applies a Euclid's algorithm with $$T_s(x) = \{Q_{s-1}(x) \cdot T_{s-1}(x)\} + T_{s-2}(x),$$

$$R_s(x) = \{Q_{s-1}(x) \cdot R_{s-1}(x)\} + R_{s-2}(x),$$

and $$Q_{s-2}(x) = R_{s-2}(x)/R_{s-1}(x),$$

wherein $T_s(x)$, $R_s(x)$, and $Q_{s-1}(x)$ are polynomials representing the position of the error, its value, and a provisional value respectively, and wherein $R_s(x)$ and $T_s(x)$ can be normalized with a minimal coefficient $T_s(0) = \delta$ such that $R(x) = R_s(x)/\delta$ and $T(x) = T_s(x)/\delta$; a stage that detects error positions $X_k$ and values $Y_K$ by conducting a Chien zero-root search in conjunction with $$Y_k = \frac{R(X_k)}{X_k^b \cdot T'(X_k)}$$

wherein $T'(X_k)$ is the first derivative of T at a place $X_k$; and a stage that uses the accordingly calculated error positions $X_k$ and values $Y_K$ to correct signal-duration matched data words in a currently present Reed-Solomon coded block. A Reed-Solomon code is a systematic block code of length n wherein $n-k=p$ checkwords are applied to k information symbols. The coding does not alter communications symbols. A Reed-Solomon code has a minimal Hamming distance $d = p+1$, that can be freely selected to detect and correct errors.

Decoding does not differentiate between data words and checkwords. A Reed-Solomon code block consists of n symbols, each of one or more bits. A symbol width of 8 bits is usually the starting point. 2·t checkwords are usually needed in correcting a symbol error t to calculate its position $X_i$ and value $Y_i$. If the defective symbol is marked as an erasure, its error position $X_i$ will be known. In this event only a single checkword will be needed to calculate error value $Y_i$. In Reed-Solomon codes, $2t + e \leq P = n - k = d - 1$, wherein i is the number of erasures. Further details on Reed-Solomon codes can be found in "On-the-Fly Decoder for Multiple Byte Errors," *IBM Journal of Research and Development*, vol. 30, No. 3 (May 1986), pp. 259–69.

Circuitry for decoding Reed-Solomon coded data is known from "A 40 MHz Encoder/Decoder Chip Generated by a Reed-Solomon Code Compiler," *IEEE* 1990 *Custom Integrated Circuits Conference*, CH2860-5/90/0000-0065, pp. 13.5.1–13.5.4. One stage calculates syndromes from the data received in a transmission section. A downstream stage calculates the polynomial error positions and values from the calculated syndrome in accordance with Euclid's algorithm. The results are subjected to a Chien zero-root search in a third stage. The resulting positions and values are employed in a fourth stage to correct the occurring data with an exclusive OR.

Such circuitry cannot be employed to correct a large number of errors in real time.

SUMMARY OF THE INVENTION

The principal object of the present invention is to improve circuitry of the aforesaid type to the extent that it can correct data arriving at a constant and high rate, higher than 40 MBit/sec for example, in real time.

This object, as well as other objects that will become apparent from the discussion that follows are achieved in accordance with the invention by the improvement comprising:

a forwards counter for counting up the data words in one block and emitting a target value $(X_i)$ simultaneously with the Chien zero-root detection;

a first stack for storing the counts $(X_i)$ that can be extracted from it at the end of each data block;

a second stack controlled by a signal for storing the counts $(X_k)$ extracted from the first stack;

a third stack for storing, simultaneously with the storage of the counts in the first stack, error values $(Y_i)$ that can be extracted from it at the end of a data block;

a fourth stack controlled by a signal for storing the error values extracted from the third stack;

a backwards counter for counting down from the value of one block length;

a comparator for comparing whatever count is at the top of the second stack with the counts emitted by the backwards counter in order to derive a control signal when the two counts are equal; and an exclusive-OR stage with one input terminal coupled to receive the error value $(Y_k)$ at the top of the fourth stack in accordance with the control signal, with another input terminal coupled to receive the signal-duration matched data words, and with an output terminal that emits corrected data words.

One advantage of the circuitry in accordance with the invention with its several stacks is that any number of errors can be corrected in real time. A particular advantage is that the correction operations can be carried out "self-controlled."

The forwards counter in one embodiment includes a multiplexer and a downstream register, whereby a value $\alpha^0 = 1$ is forwarded to one input of the multiplexer at the beginning of a block and the values emitted by the register are multiplied by another value $\alpha^1$ and forwarded to another of the multiplexer's inputs at other times.

The backwards counter in another embodiment includes another multiplexer and another downstream register, whereby the value of one block length is forwarded to one input terminal of the multiplexer at the beginning of a block and the values emitted by the register are forwarded to another of the multiplexer's input terminals at other times.

The preferred embodiments of the present invention will now be described with reference to the accompanying drawing.

DESCRIPTION OF THE PREFERRED EMBODIMENT

Figure 1:
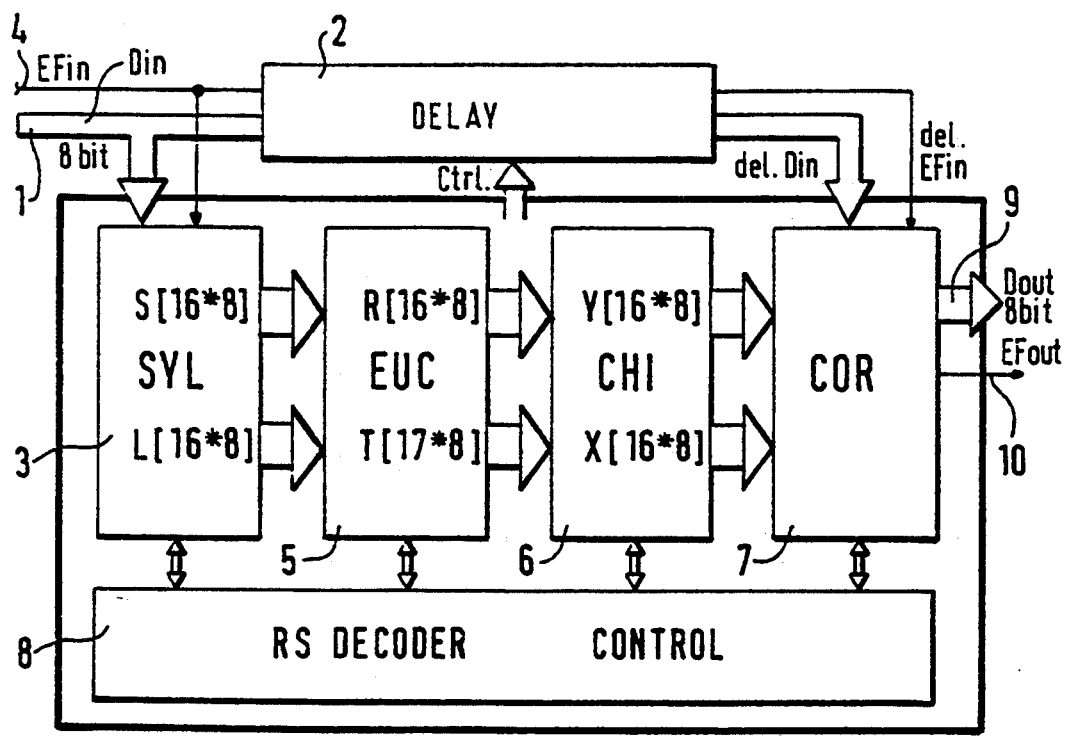
FIG. 1 is an overall block diagram of a known Reed-Solomon decoder

Every symbol of m bits in a Reed-Solomon code is by definition an element of a Galois field $GF(2^m)$. The sequence of $2^m$ symbols is defined as the basis of the finite field arithmetic by a field-generator polynomial p(x). The symbol width limits the maximal block length of an Reed-Solomon code of $2^m - 1$ in that the elements of the field are needed for an unambiguous position number in the block. A zero is a neutral element with respect to addition and an $\alpha^0 = 1$ a neutral element with respect to multiplication. A field is accordingly defined over an irreducible field-generator polynomial. Once a primitive element $\alpha$ of place number m has been defined, all subsequent elements can be expressed as powers of $\alpha$. Since $\alpha$ is a root of field-generator polynomial p(x) and since there are only m non-zero roots, $p(x)=0$ for all other elements. A Galois field can accordingly be defined as a finite sequence of $2^m - 1$ elements. A binary representation allows simple addition by way of a bit-wise exclusive-OR, and an exponential representation simple multiplication by adding the exponents modulo $q = r^m - 1$. In circuitry terms, this corresponds to a binary adder with its carry-over output terminal communicating with a carried-over input terminal.

A Reed-Solomon code of distance d over the field generated by field-generator polynomial p(x) is defined by a code-generator polynomial $$G(x) = \prod_{i=b}^{b+d-2} (x + \alpha^i) = \sum_{i=0}^{d-1} g_i x^i$$

Although b=0 here, it can be any constant in field $GF(2^m)$. A lawful code vector c(x) is constructed by shifting an information vector $i(x) \cdot x^p$ by p places, dividing it by code-generator polynomial G(x), and attaching the resulting parity vector p(x) to the now unoccupied places in information vector i(x). Code vector c(x) can be evenly divided by all the roots of code-generator polynomial G(x).

A carried-over Reed-Solomon coded code block c(x) consists as previously mentioned of k information places followed by p checkwords. Such a code ensures that c(x) can be evenly divided by all roots of code-generator polynomial G(x) as long as there are no errors e(x) or erasures u(x). Developing a reception vector r(x) at the roots of code-generator polynomial G(x) will produce values that depend on the errors received but not on the information vectors i(x) carried over. These values are called syndromes. The m syndromes $S_j$ (j=0, ..., [d-2]) are calculated from the equation:

$$S_{b+j} = \sum_{i=0}^{n-1} r_i \alpha^{i(b+j)} = \sum_{k=0}^{e+t-1} Y_k(X_k)^{(b+j)}.$$

The intercepted vector (x) can be represented by the polynomial $$r(x) = r_{n-1} x^{n-1} + r_{n-2} x^{n-2} r_1 x^1 r_0$$

wherein x is a position in the polynomial for each intercepted symbol $r_i$. The first intercepted (data) symbol is $r_{n-1}$ and the last (parity) symbol is $r_0$. The polynomial can be stored by way of its coefficients $r_i$ alone.

Since the development of an error-free interception vector r(x) at a zero place in the code-generator polynomial supplies the value 0, the values of the syndromes are to be considered sums of the position-weighted errors $Y_K$ at places $X_k$. The symbols constitute remainders from a division of data flow r(x) by all factors $(x + \alpha^i)$ in the code-generator polynomial, whereby $$S_j = \sum_{k=0}^{e+t-1} Y_k(X_k)^j$$

(for all syndromes $S_0, \ldots, S_{d-2}$ where b=0).

When the position of an event $X_k$ is retained during an erasure, up to e=p erasures can be calculated with p syndromes and p error positions $X_k$ as long as $2t+e \leq p$, wherein t is the number of unidentified errors.

Since the syndromes constitute in accordance with the equation a set of n non-linear equations, p solutions can be obtained. The solutions to this system of equations are coefficients of an error-position polynomial that has a value of 0 at the error positions.

The decoding of Reed-Solomon coded data blocks in accordance with the aforesaid Euclid's algorithm is described in "Simplified Procedure for Correcting Both Errors and Erasures of RS Code Using Euclid Algorithm," by Truong Eastman Reed Hsu, *IEEE Proceedings*, Vol. 135, Pt. E, No. 6 (November 1988). The Euclid's algorithm can be broken down into the following steps:

1. Calculating a syndrome $S_j$ and an erasure-position polynomial L(x) and setting e=deg L(x),
2. Calculating what is called a Forney syndrome $\tau(x) = S(x)L(x) \mod x^{d-1}$, and
3. Setting T(x)=L(x) and R(x)=$\tau(x)$ for e=d-1=p and otherwise determining T(x) and R(x) with a Euclid's algorithm comprising the recursive formulas:

$$T_s(x) = \{Q_{s-1}(x) \cdot T_{s-1}(x)\} + T_{s-2}(x),$$

$$R_s(x) = \{Q_{s-1}(x) \cdot R_{s-1}(x)\} + R_{s-2}(x),$$

and $$Q_{s-1}(x) = R_{s-2}(x) / R_{s-1}(x)$$

with the initial values $$T_0(x) = L(x),$$

$$T_{-1}(x) = 0,$$

$$R_{-1}(x) = x^{d-1},$$

and $$R_0(x) = \tau(x).$$

$T_s(x)$, $R_s(x)$, and $Q_{s-1}(x)$ are polynomials representing the position of the error, its value, and a provisional value respectively. $R_s(x)$ and $T_s(x)$ can be normalized with the minimal coefficient $T_s(0)=\delta$, whereby $R(x)=R_s(x)/\delta$ and $T(x)=T_s(x)/\delta$. $R(x)$ and $T(x)$ are the results of the Euclid's algorithm.

The roots of $T(x)$ are inverse (down-counted) positions of errors and erasures $X_k^{-1}$. The individual error positions $X_k^{-1}$ are located in the present embodiment by a Chien zero-root search. The procedure simultaneously determines error values $Y_k$ from $$Y_k = \frac{R(X_k)}{X_k^b \cdot T'(X_k)}.$$

$T'(X_k)$ is the first derivative of T at a place $X_k$. The derivatives of polynomials are constructed in finite fields, with n-fold addition yielding 0 for even n and the element itself for odd n. The procedure will accordingly determine the desired error position and its corresponding error value.

FIG. 1 is an overall block diagram of a Reed-Solomon decoder. A data bus 1 conveys 8-bit wide data words $D_{in}$ in Reed-Solomon coded data blocks to both a delaying stage 2 and a function stage 3, which essentially constructs syndromes. Paralleling data bus 1, an error signal $EF_{in}$ is forwarded to delaying stage 2 and function stage 3 over a line 4.

The syndromes are calculated in function stage 3 with 16 syndrome generators that construct the remainder of a division $c(x)/(x+\alpha^i)$. The syndrome generators are initiated at the beginning of each block by separating a feedback through an AND gate. The syndromes from the last block are forwarded at the same rate to a function stage 5 that determines erasures in accordance with the aforesaid Euclid's algorithm. A generator in the same stage detects erasure positions L(x) by counting through all the positions in the block. When an erasure appears, it's position is stored in an empty register. The registers are also zeroed at the beginning of a block. When more erasures appear than are permitted by a correction ceiling, L(x) is set at 0. In this case, limited error correction can be attempted. Erasure vector L(x) is inverted in function stage 5 over the length of a block.

Function stage 5 comprises several banks of registers with widths of 16 and 17 bytes. Since the functionality of this stage is in itself well known, it need not be discussed herein in detail. The aforesaid error-position polynomials $T_s(x)$ and error-value polynomials $R_s(x)$ are constructed by polynomial division and addition and can be obtained at the output terminals of function stage 5.

The zero roots of polynomials $T_s(x)$ and $R_s(x)$ are determined in downstream function stages 6 and 7, which will be described in detail hereinafter with reference to FIGS. 2 and 3. Defective data words, which have been forwarded along with the error signal from the output terminal of delaying stage 2 to function stage 7, are corrected from the resulting error values $Y_k$ and error positions $X_k$. Control of the four function stages 3 through 7, as well as the delaying stage 2, is effected by an RS decoder control unit 8. The output of the function stage 7, a stream of 8-bit wide data words $D_{out}$, can be taken from a bus 9. Any defective words will be corrected in accordance with the corrective capability of the particular decoder employed. Data blocks that exceed the capability of the decoder are characterized by an error signal $EF_{out}$ that, paralleling the data emitted over data bus 9, is shifted to a line 10.

Figure 2:
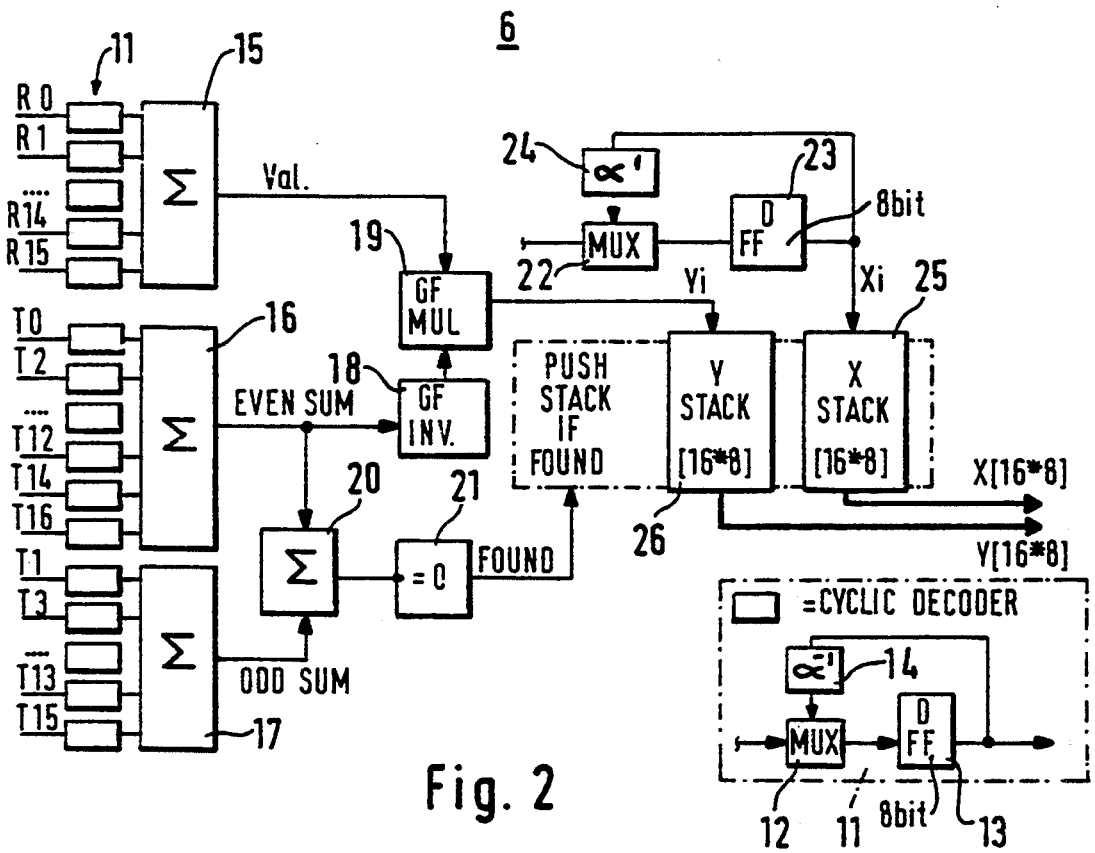
FIG. 2 is a detailed block diagram of the Chien zero-root search stage in accordance with the invention as applied to the equipment illustrated in FIG. 1.

The function stage 6 shown in FIG. 1 is illustrated in detail in FIG. 2. The polynomials obtained from function stage 5 are in the present embodiment forwarded to the thirty-three components of a cyclic decoder 11. The structure of one such component is illustrated by the block diagram inside the dot-and-dash lines in the bottom right corner of the figure. The signals representing the polynomial are loaded at the beginning of the block in a register 13 by way of a multiplexer 12. Each element $R_i$ or $T_i$ is constantly cyclically multiplied by symbols $\alpha^{-i}$ available in a subsidiary stage 14. If a zero root $T(x)$ is discovered—if, that is, the sum of all elements $T_i$ is 0—the error value can be calculated from $Y_k = R(x_k)/T'(x_k)$ for the case where b=0.

The derivative $T'(x)$ provides, in accordance with the laws of a Galois field, the polynomial of the even coefficients of T. Cyclic decoders of this type are known from the hereintofore cited *IBM Journal of Research and Development*. Vol. 30, No. 3 (May, 1986), pp. 259–69.

The signals from the individual cyclic decoders are added in stages 15, 16, and 17. The sums VAL, EVENSUM, and ODDSUM at the output terminals of these stages constitute an exclusive-OR gate for all the bits in one plane. In the present case for example, bit 0 is constructed from VAL by way of a 16-fold conjunction of bits 0 from $R_0$ to $R_{15}$. A division R/T' is carried out by multiplying the inverses in stages 18 and 19. EVENSUM and ODDSUM are added in a stage 20. A zero poll is conducted in stage 21. If the FOUND signal at the output terminal of stage 21 has a HIGH level, the output from a position counter comprising a multiplexer 22, a register 23, and a stage 24 is stacked along with the resulting error value $Y_k$ in a stack 25 that stores error positions $X_i$. It is assumed in the present case that the stack comprises 16 registers. The stacking occurs in a register 0, while the previous contents of registers 0 through 14 move up one step to registers 1 through 15. The contents of register 15 are lost. The stack operates last-in first-out (LIFO) in that the Chien procedure calculates inverse error positions backwards. Another stack 26 operates in parallel with first stack 25 and stores error values $Y_i$.

Figure 3:
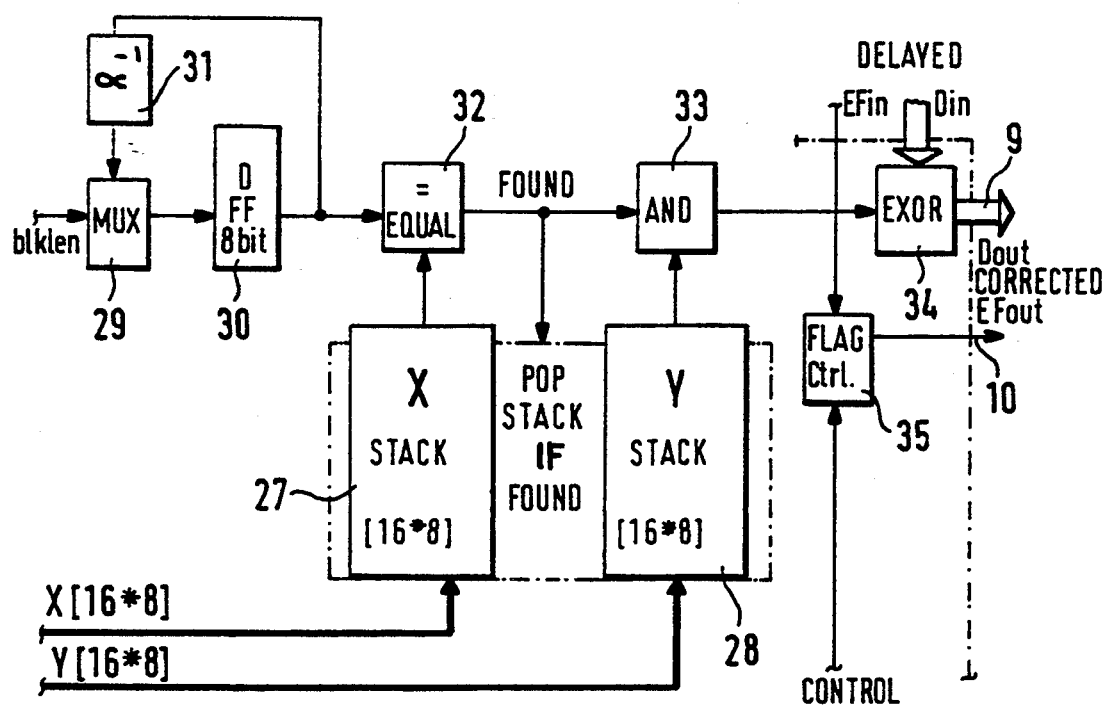
FIG. 3 is a detailed block diagram of the correction stage in accordance with the invention as applied to the equipment illustrated in FIG. 1.

FIG. 3 is a block diagram of function stage 7. It has one stack 27 for error positions $X_k$ and another stack 28 for error values $Y_k$. These factors are taken over at the end of a data block along with the factors in stacks 25 and 26. The circuit illustrated in FIG. 2 can accordingly be re-initialized and will be available for another Chien search.

The order of error positions $X_k$ and error values $Y_k$ is reversed with an inverse position counter consisting of a multiplexer 29, a register 30, and a stage 31. Multiplexer 29 loads register 30 with the final block-length value at the beginning of a block. The outputs from register 30 are at other time fed back with, and multiplied by the values of the symbols $\alpha^{-1}$ by way of stage 31. An error position $X_k$ is located when the data emitted from the inverse position counter is identical with the contents of a register 0 in stack 27. The comparison is carried out in a comparator 32, which emits a FOUND signal in the form of an entry pulse for an AND gate 33. Gate 33 is connected to another output terminal of stack 28. The error value $Y_K$ at the output terminal of AND gate 33 is logically added to data value $D_{in}$, which has been delayed in delaying stage 2, in an exclusive-OR stage 34, accordingly carrying out the correction. The error signal $EF_{in}$ arrives, also delayed by delaying stage 2, at an outgoing line 10 by way of a stage 35 and subject to the Reed-Solomon decoder's controls 8. If there is a logical HIGH level in the FOUND signal, the uppermost factor in stacks 27 and 28 is removed and their registers 1 through 15 will be copied onto register positions 0 through 14. Once all the errors have been corrected, there will be a logical 0 on the stack, in which event no further coincidence with the inverse position counter may occur.

The circuitry in accordance with the invention accordingly features in addition to the aforesaid advantages the advantage that no special operating controls are needed to handle any desired number of errors because it is self-controlled by the factors in stack 27. All that is necessary is to load the inverse position counter with a block length at the beginning of a block in order to subsequently count down cyclically. The procedure is equivalent to multiplication by $\alpha^{-1}$. When erasures are also corrected in the circuitry in accordance with the invention, the error signal must be delayed in the form of a ninth bit along with the data. Such erasures can also result from drop-out. Otherwise it will be sufficient to delay the arriving data signal $D_{in}$ at a word width of 8 bits. Controls 8 will modify the delayed error signal $EF_{in}$ such that a correct status for each data bit obtainable at the output terminal of exclusive-OR stage 34 will be simultaneously available on line 10. The present pipeline processing allows a continuous operating speed of 0 to 20 MHz at a symbol width of 8 bits. The present embodiment supports a Reed-Solomon code with 1 to 16 checkwords. There has thus been shown and described novel circuitry for detecting and correcting errors in data words that fulfills all the objects and advantages sought therefor. Many changes, modifications, variations, and other uses and applications of the subject invention will, however, become apparent to those skilled in the art after considering this specification and the accompanying drawings, which disclose the preferred embodiment thereof. All such changes, modifications, variations, and other uses and applications that do not depart from the spirit and scope of the invention are deemed to be covered by the invention, which is to be limited only by the claims that follow.

What is claimed is:

1. In circuitry for detecting and correcting errors in data words occurring in Reed-Solomon coded blocks and comprising a stage that constructs syndromes in the data flowing through the blocks, a stage that detects erasures in the syndromes, a stage that applies a Euclid's algorithm with $$T_s(x) = \{Q_{s-1}(x) \cdot T_{s-1}(x)\} + T_{s-2}(x),$$

$$R_s(x) = \{Q_{s-1}(x) \cdot R_{s-1}(x)\} + R_{s-2}(x),$$

and $$Q_{s-1}(x) = R_{s-2}(x)/R_{s-1}(x)$$

wherein $T_s(x)$, $R_s(x)$, and $Q_{s-1}(x)$ are polynomials representing the position of the error, its value, and a provisional value respectively and $R_s(x)$ and $T_s(x)$ can be normalized with a minimal coefficient $T_s(0) = \delta$ such that $R(x) = R_s(xi/\delta$ and $T(x) = T_s(x)/\delta$, a stage that detects error positions $X_k$ and values $Y_k$ by conducting a Chien zero-root search in conjunction with $$Y_k = \frac{R(X_k)}{X_k^b \cdot T'(X_k)}$$

wherein $T'(X_k)$ is the first derivative of T at a place $x_k$, and a stage that uses the accordingly calculated error positions $X_k$ and values $Y_k$ to correct signal-duration matched data words in a currently occurring Reed-Solomon coded block, the improvement comprising:

a forwards counter for counting up the data words in one block and emitting a target value $(X_i)$ simultaneously with the Chien zero-root detection;

a first stack, coupled to the forwards counter, for storing counts $(X_i)$, representative of error positions, that can be extracted from it at the end of each data block;

a second stack, coupled to the first stack, for storing the the error positions $(X_k)$ extracted from the first stack;

a third stack for storing, simultaneously with the storage of the counts in the first stack, error values $(Y_i)$ that can be extracted from it at the end of each data block;

a fourth stack, coupled to the third stack, for storing the error values $(Y_k)$ extracted from the third stack;

a backwards counter for counting down from the value of one block length;

a comparator, coupled to the backwards counter and to the second stack, for comparing whatever count is at the top of the second stack with the counts emitted by the backwards counter in order to derive a control signal when the two counts are equal; and an exclusive-OR stage with one input terminal coupled to receive the error value $(Y_k)$ at the top of the fourth stack in accordance with the control signal, with another input terminal coupled to receive the signal-duration matched data words, and with an output terminal that emits corrected data words.

2. The circuitry defined in claim 1, wherein the forwards counter includes a multiplexer and a downstream register, wherein a value $\alpha^0 = 1$ is forwarded to one input terminal of the multiplexer at the beginning of a block and the values emitted by the register are multiplied by another value $\alpha^1$ and forwarded to another of the multiplexer's input terminals at other times.

3. The circuitry defined in claim 1, wherein the backwards counter includes another multiplexer and another downstream register, wherein the value of one block length is forwarded to one input terminal of the multiplexer at the beginning of a block and the values emitted by the register are forwarded to another of the multiplexer's input terminals at other times.

4. The circuitry defined in claim 3, wherein the values emitted by the register are multiplied by another value $\alpha^{-1}$.

* * * * *